(12) United States Patent
Sugiura

(10) Patent No.: US 7,443,075 B2
(45) Date of Patent: Oct. 28, 2008

(54) ENTRAPMENT DETECTING SYSTEM

(75) Inventor: Takehiko Sugiura, Kariya (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 370 days.

(21) Appl. No.: 11/441,124

(22) Filed: May 26, 2006

(65) Prior Publication Data

US 2006/0267453 A1 Nov. 30, 2006

(30) Foreign Application Priority Data

May 30, 2005 (JP) ............................. 2005-156996

(51) Int. Cl.
*H01L 41/08* (2006.01)
(52) U.S. Cl. ...................... 310/319; 310/329; 310/338; 310/339; 310/800
(58) Field of Classification Search ................. 310/328, 310/329, 339, 316.01, 319
See application file for complete search history.

(56) References Cited

U.S. PATENT DOCUMENTS 6,213,442 B1 * 4/2001 Ivers et al. .................. 248/550
6,924,787 B2 * 8/2005 Kramer et al. .............. 345/156
7,324,894 B2 * 1/2008 Urman et al. ............... 701/124

FOREIGN PATENT DOCUMENTS

| JP | 3300660 B2 | 4/2002 |
|---|---|---|
| JP | 2003-106048 A | 4/2003 |
| JP | 3415014 B2 | 4/2003 |

* cited by examiner

*Primary Examiner*—Mark Budd
(74) *Attorney, Agent, or Firm*—Sughrue Mion, PLLC

(57) ABSTRACT

An entrapment detecting system includes a detection portion provided at an opening/closing apparatus for detecting an acceleration thereof on the basis of an output from a piezoelectric sensor for outputting a voltage corresponding to the acceleration and a control portion for judging whether or not an object is entrapped by the opening/closing apparatus on the basis of a detected result of the detection portion. The detection portion includes a current control portion connected to the control portion in series as a closed circuit whereby electricity is supplied from the control portion to the current control portion. The current control portion changes a consumed current of the detection portion on the basis of the output from the piezoelectric sensor. The control portion judges whether or not the object is entrapped on the basis of the consumed current of the detection portion changed by the current control portion.

12 Claims, 4 Drawing Sheets

US 7,443,075 B2

ENTRAPMENT DETECTING SYSTEM

CROSS REFERENCE TO RELATED APPLICATIONS

This application is based on and claims priority under 35 U.S.C. § 119 to Japanese Patent Application 2005-156996, filed on May 30, 2005, the entire content of which is incorporated herein by reference.

FIELD OF THE INVENTION

This invention generally relates to an entrapment detecting system. More particularly, this invention pertains to an entrapment detecting system for detecting an object entrapped by an opening/closing apparatus.

BACKGROUND

In an automatic door of a building or an electric slide door apparatus for a vehicle such as a wagon or a vain, an electric opening/closing apparatus is provided for sliding a door by a motor or the like to open/close the door. In the electric opening/closing apparatus like this, there is a possibility that an object is entrapped between a door frame and the door at the time of a closing operation of the door. An electric opening/closing apparatus including a control means for detecting an entrapment to stop the closing operation of the door or to reverse the closing operation to the opening operation of the door in such a situation is suggested.

In patent document 1 and patent document 2 mentioned below, an automatic opening/closing apparatus is described that can reliably detect an entrapment of an object by a moving body such as a door panel of a slide door apparatus of a vehicle. The automatic opening/closing apparatus described in these documents includes a pressure-sensitive sensor for detecting a pressing force generated by the entrapment of the object. Within the pressure-sensitive sensor, a long tube made of an elastic material, includes a cross hole in a casing portion of the tube. The cross hole is gradually displaced around a center of the tube. Wirings, which serve as electrodes, are helically provided in and along the cross hole so that each wiring is apart from other wiring. When the pressing force is applied to the pressure-sensitive sensor by the object being entrapped, the casing portion is elastically deformed, therefore the cross hole in the casing portion is deformed. At this point, the entrapment is detected by detecting that some of, or all of the wirings provided in the cross hole, are in contact with each other and are short-circuited.

However, for example, in a case where the pressure-sensitive sensor is provided along the door frame, there would be a possibility where bending of the sensor itself or a pressure applied to the pressure-sensitive sensor at the time of installation thereof should be taken into consideration and a degree of freedom of the installation is limited. Further, in the pressure-sensitive sensor, as described above, the wirings in the tube are made in contact one another by the pressing force generated by the entrapment of the object. Accordingly, though the pressure-sensitive sensor can preferably detect the entrapment if the object is firmly entrapped, the pressure-sensitive sensor cannot always preferably detect the entrapment at the stage that an object is in contact with the pressure-sensitive sensor immediately before the object is entrapped. Therefore, an entrapment sensor, which is more sensitive, is desired. For obtaining this, currently, as described in patent document 3 mentioned below, an entrapment sensor, which detects an entrapment on the basis of vibrations detected by a piezoelectric sensor, is being investigated and is gradually put to practical use.

Patent Document 1) JP3300660B2 paragraphs from 34 to 35, FIGS. 1 to 3)

Patent Document 2) JP3415014B2 (paragraphs 43 to 44, FIG. 8)

Patent Document 3) JP2003-106048A (paragraphs 5 to 7, 17 to 27, FIGS. 4 and 5)

However, it is not easy to directly change an entrapment sensor system, in which a conventionally utilized pressure-sensitive sensor is utilized, to an entrapment sensor system, in which a piezoelectric element is utilized.

A need thus exists for an entrapment detecting system, which can be obtained by changing a pressure-sensitive sensor utilized in an entrapment detection sensor to a piezoelectric sensor with a minimum system change, and which has good sensitivity. The present invention has been made in view of the above circumstances and provides such an entrapment detecting system.

SUMMARY OF THE INVENTION

According to an aspect of the present invention, an entrapment detecting system includes a detection portion provided at an opening/closing apparatus for detecting an acceleration of the opening/closing apparatus on the basis of an output from a piezoelectric sensor for outputting a voltage corresponding to the acceleration of the opening/closing apparatus and a control portion for judging whether or not an object is entrapped by the opening/closing apparatus on the basis of a detected result of the detection portion. The detection portion includes a current control portion connected to the control portion in series as a closed circuit whereby electricity is supplied from the control portion to the current control portion. The current control portion changes a consumed current of the detection portion on the basis of the output from the piezoelectric sensor. The control portion judges whether or not the object is entrapped by the opening/closing apparatus on the basis of the consumed current of the detection portion changed by the current control portion.

According to a further aspect of the present invention, an entrapment detecting system includes a detection portion provided at a slide door of a vehicle and including a piezoelectric sensor for outputting a voltage according to a moving state of the slide door, the detection portion detecting the moving state of the slide door on the basis of an output from the piezoelectric sensor and a control portion for judging whether or not an object is entrapped between the slide door and a door frame of the vehicle when the slide door moves on the basis of a detected result of the detection portion. The detection portion is connected to the control portion in series whereby electricity is supplied from the control portion to the detection portion. The detection portion includes a current control portion for changing a consumed current of the detection portion on the basis of the output from the piezoelectric sensor. The control portion judges whether or not the object is entrapped on the basis of the consumed current of the detection portion.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

Before an embodiment of the present invention will be explained, a conventional entrapment detecting system, in which a pressure-sensitive sensor is utilized, win be explained.

Figure 3:
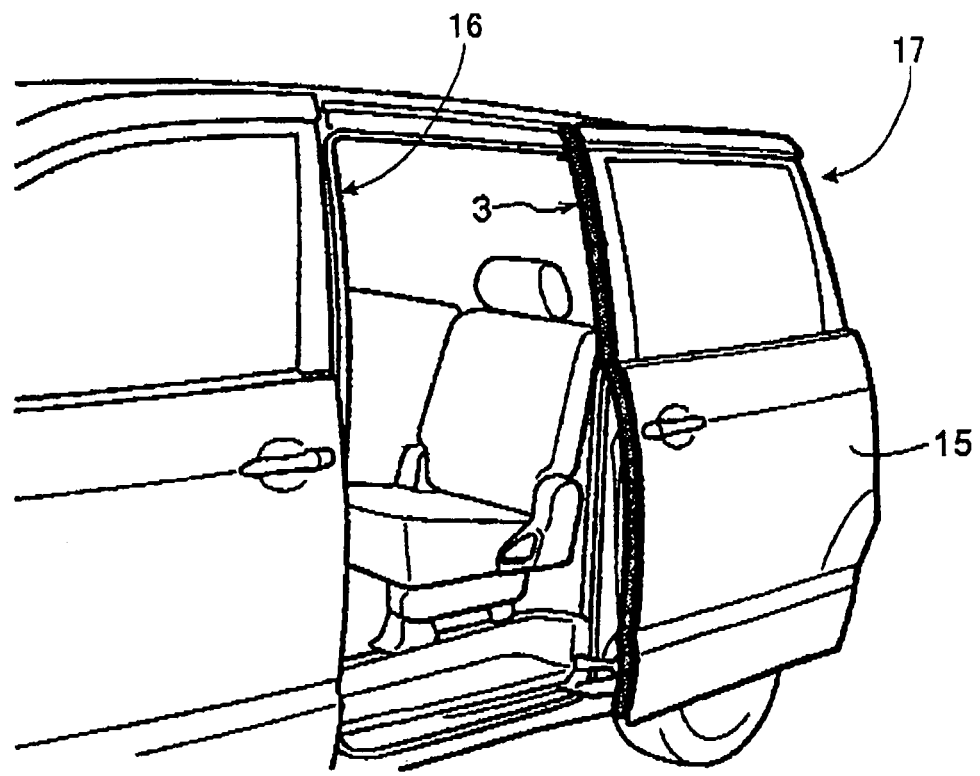
FIG. 3 represents a perspective view illustrating an example of providing the piezoelectric sensor illustrated in FIG. 2A or FIG. 2B at an opening/closing apparatus.
Figure 6:
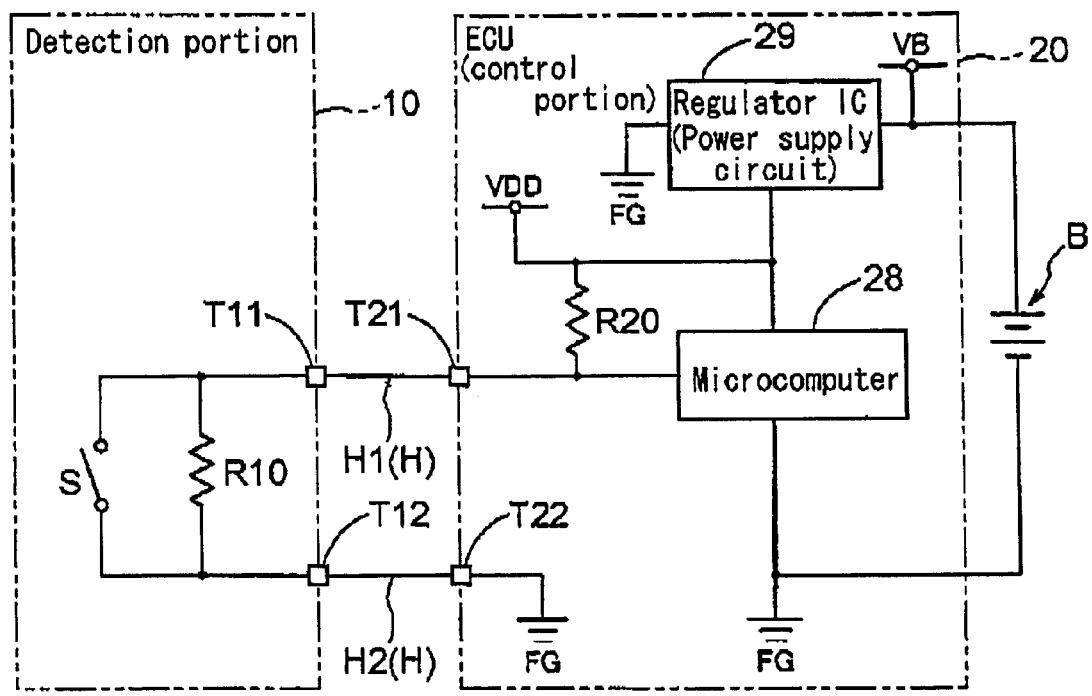
FIG. 6 represents a schematic block diagram illustrating an example of an entrapment detecting system in which a conventional pressure-sensitive sensor is utilized.

In the above-described entrapment sensor system described in patent documents 1 and 2, in which a conventional pressure-sensitive sensor is utilized, the pressure-sensitive sensor as a detection portion is connected with a control portion for judging an entrapment through two terminals included in the pressure-sensitive sensor (please refer to FIG. 3 of patent Document 1). For example, as illustrated in FIG. 6, a detection portion 10 (pressure-sensitive sensor) includes terminals T11 and T12. The terminal T11 is connected with a terminal T21 of the control portion 20, and the terminal T12 is connected with a terminal T22 of the control portion 20, by a cable H (H1, H2), or the like, respectively. In a normal state, an input to a microcomputer 28 of the control portion 20 is a high (H) state (high voltage) determined from a division of a voltage between a power supply (voltage VDD, supplied from a battery B of a voltage VB and regulated by a regulator IC 29) and a ground FG by a resistor R20 in the control portion 20 and a resistor R10 in the detection portion 10. When an entrapment occurs and the wirings in the detection portion 10 gets in contact one another, a switch S in FIG. 6 becomes conductive and the input to the microcomputer 28 becomes a low (L) state (low voltage). By this, the microcomputer 28 judges that an entrapment occurred.

Figure 7:
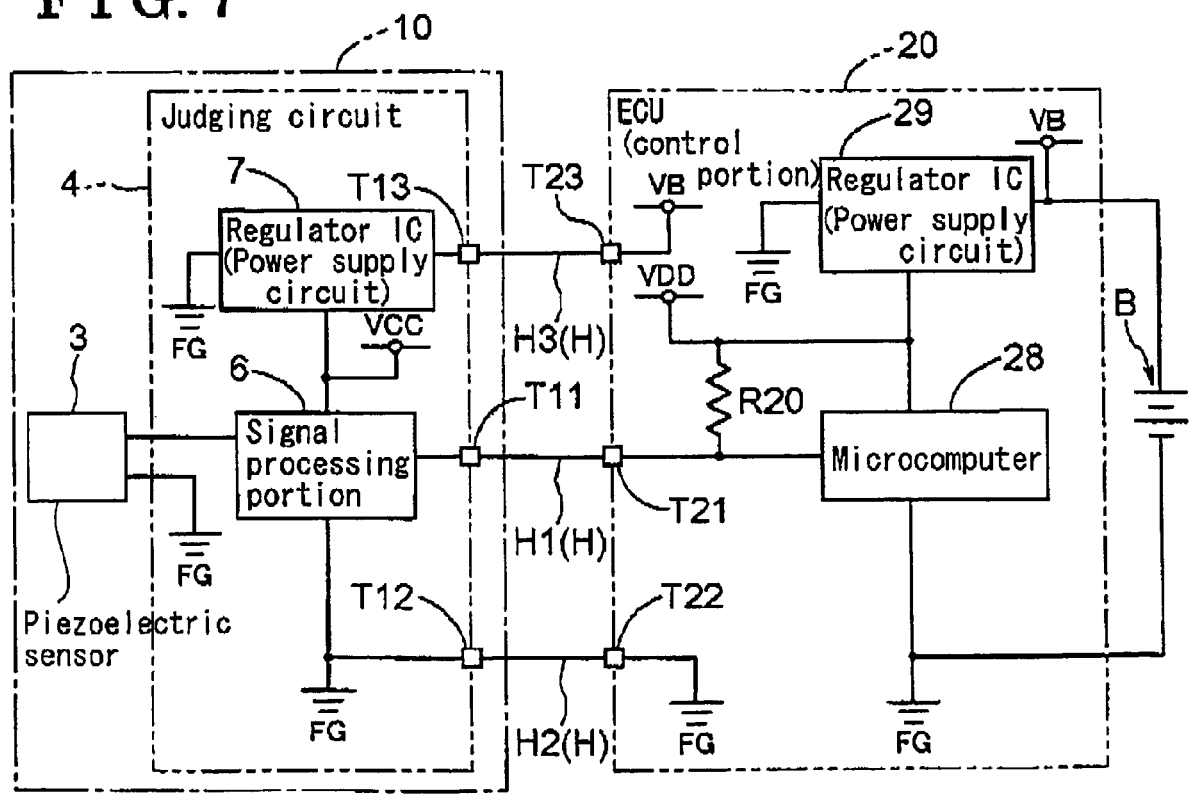
FIG. 7 represents a schematic block diagram illustrating a configuration example of an entrapment detecting system in which a piezoelectric sensor is utilized instead of a pressure-sensitive sensor illustrated in FIG. 6.

Next, an example, in which the pressure-sensitive sensor included in the detection portion 10 is replaced by a piezoelectric sensor 3, will be explained with reference to FIG. 7. The piezoelectric sensor 3 utilizes a piezoelectric effect, in which a voltage is generated by deformation of a piezoelectric element induced by vibrations or the like. Because the voltage generated by the piezoelectric effect is very small, a signal processing portion 6 such as an operational amplifier becomes necessary in a judging circuit 4 to process an output from the piezoelectric sensor 3 before the output is transmitted to a microcomputer 28. Therefore, a power supply (regulated by a regulator IC 7) should be provided in a circuit (through a power supply wire H3, connecting a terminal T23 with a terminal T13, and a ground wire H2, connecting a terminal T22 with a terminal T12). Further, a signal wire H1, connecting a terminal T21 with a terminal T11, for transmitting an entrapment detection signal output from the signal processing portion 6 is required, therefore, in total, three signal wires H become necessary. Accordingly, the terminal T23 should be added to the control portion 20. In the meantime, a power for the microcomputer 28 is supplied from a battery B (voltage VB) and regulated to a voltage VDD by a regulator IC 29. A resistor R20 serves as a pull-up resistor. FG indicates a ground.

As described above, when an entrapment sensor system, in which a conventionally utilized pressure-sensitive sensor is utilized (FIG. 6), is directly changed to an entrapment detecting system, in which a piezoelectric element is utilized (FIG. 7), a connector included in the control portion 20 should be changed, furthermore as described above, the number of wires increases. The change of the connector leads to increases in cost, and the increase in the number of wires leads to degradation in reliability. Further, in an example illustrated in FIGS. 6 and 7, in a case where the control portion 20 includes the microcomputer 28, there can be a case where a program thereof needs to be changed. Then, in a case where the program of the microcomputer 28 is recorded in a read only memory (ROM) by a masking process (including built-in), cost for the masking process would be required. When the program is changed, consistency with other systems needs to be evaluated. Therefore, time taken for evaluation for ensuring reliability increases. Thus, it is not easy to directly change the entrapment sensor system, in which a conventionally utilized pressure-sensitive sensor is utilized, to the entrapment detecting system, in which a piezoelectric element is utilized.

Next, an entrapment detecting system according to an embodiment of the present invention will be explained with reference to FIG. 1. According to the embodiment of the present invention, as illustrated in the figure, the entrapment detecting system according to the embodiment includes a detection portion 1 having a piezoelectric sensor 3 provided at an opening/closing portion of an opening/closing apparatus and an ECU (electronic control unit) 2 as a control portion for judging whether or not an object is entrapped by the opening/closing apparatus on the basis of a detection result of the detection portion 1. The piezoelectric sensor 3 outputs a voltage in accordance with an acceleration (moving state) of the opening/closing portion of the opening/closing apparatus (corresponding to a changing level of deformation of the piezoelectric sensor 3). The detection portion 1 includes, in addition to the piezoelectric sensor 3, a judging circuit 4 for amplifying the output voltage from the piezoelectric sensor 3 and for performing signal processing, for example, to judge whether or not the output voltage is a signal corresponding to a predetermined condition.

Figure 2A:
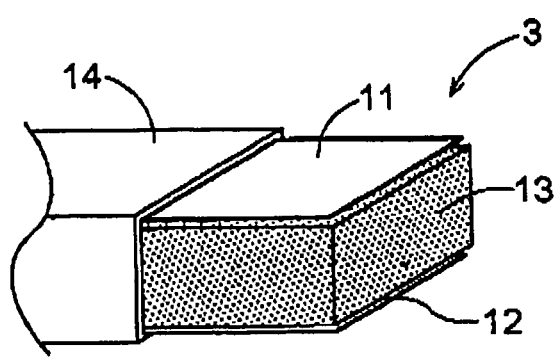
FIG. 2A and FIG. 2B represent model diagrams illustrating configuration examples of a piezoelectric sensor illustrated in FIG. 1.
Figure 2B:
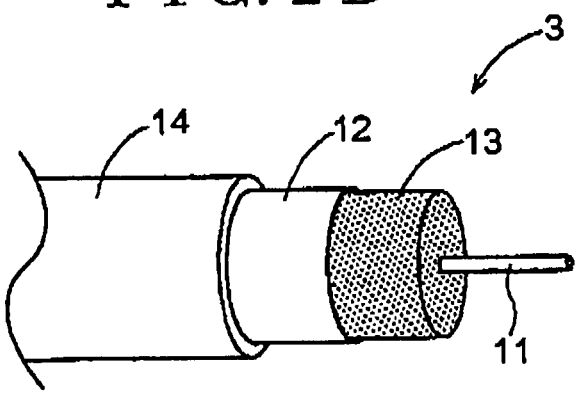

FIG. 2A and FIG. 2B represent model diagrams illustrating configuration examples of the piezoelectric sensor 3. The piezoelectric sensor includes a piezoelectric body and two electrodes, which sandwich the piezoelectric body. Deformation generated by vibrations such as acceleration in the piezoelectric body generates a voltage between the electrodes. FIG. 2A represents a diagram illustrating a configuration in which a piezoelectric body 13 is sandwiched between a planer first electrode 11 and a planer second electrode 12. FIG. 2B represents a diagram illustrating an example of a coaxial configuration. Here, a piezoelectric body 13 is sandwiched between a first electrode 11 configured by rolling a conductive body around a wire or a core and a tubular second electrode 12. Then, an insulating sheath 14 is provided around the second electrode 12 to cover entire parts. In this coaxial configuration, provision to a bended portion can be easier than in the planer code configuration illustrated in FIG. 2A.

As described above, two examples were presented. However, a shape of the piezoelectric sensor 3, in which a piezoelectric element (piezoelectric body) is utilized, is not limited to the shapes described above, FIG. 3 represents a perspective view illustrating an example in which a piezoelectric sensor is provided at an opening/closing apparatus. In this case, a slide door apparatus of a vehicle 17 is taken as an example of the opening/closing apparatus. In this example, the piezoelectric sensor 3 is provided along an end portion of a door 15 (slide door). Of course, it is also possible to provide the piezoelectric sensor 3 along a door frame 16. As described above, because an output of the piezoelectric sensor 3 is weak, it is more preferable that a transmission line to a judging circuit 4 is shorter. Accordingly, in a case where the piezoelectric sensor 3 is provided along the end portion of the door 15, it is preferable that the judging circuit 4 is provided in the door 15.

As described above, because signal processing, for example, amplification of the voltage output from the piezoelectric sensor 3, or the like, is performed in the judging circuit 4, it is not problematical even if the ECU 2 is provided apart from the detection portion 1 to some extent. As illustrated in FIG. 1, the judging circuit 4 includes two terminals T11 and T12, and the ECU 2 includes two terminals T21 and T22. Then, the detection portion 1 is connected to the ECU 2 by cables H including a wiring H1 for connecting the terminal T11 with the terminal T21 and a wiring H2 for connecting the terminal T12 with the terminal T22.

In the meantime, as described above, because the cables H include two wirings, when replacing the entrapment detecting system including the detection portion 10, in which the pressure-sensitive sensor as illustrated in FIG. 6 is utilized, with the entrapment detecting system including the detection portion 1, in which the piezoelectric sensor is utilized, the same harness parts can be utilized. Further, because a space required for wiring cables can be small, wiring is possible in a thin clearance or a small hole such as a body or a door panel of the vehicle 17. The wiring is also possible in a waterproof protector of the detection portion 1, or the like. Further, the less the number of terminals of harnesses or connectors becomes, the smaller the factor of degrading reliability, such as troubles or noises, becomes. Accordingly, an ordinary level can be maintained also in terms of reliability.

Figure 1:
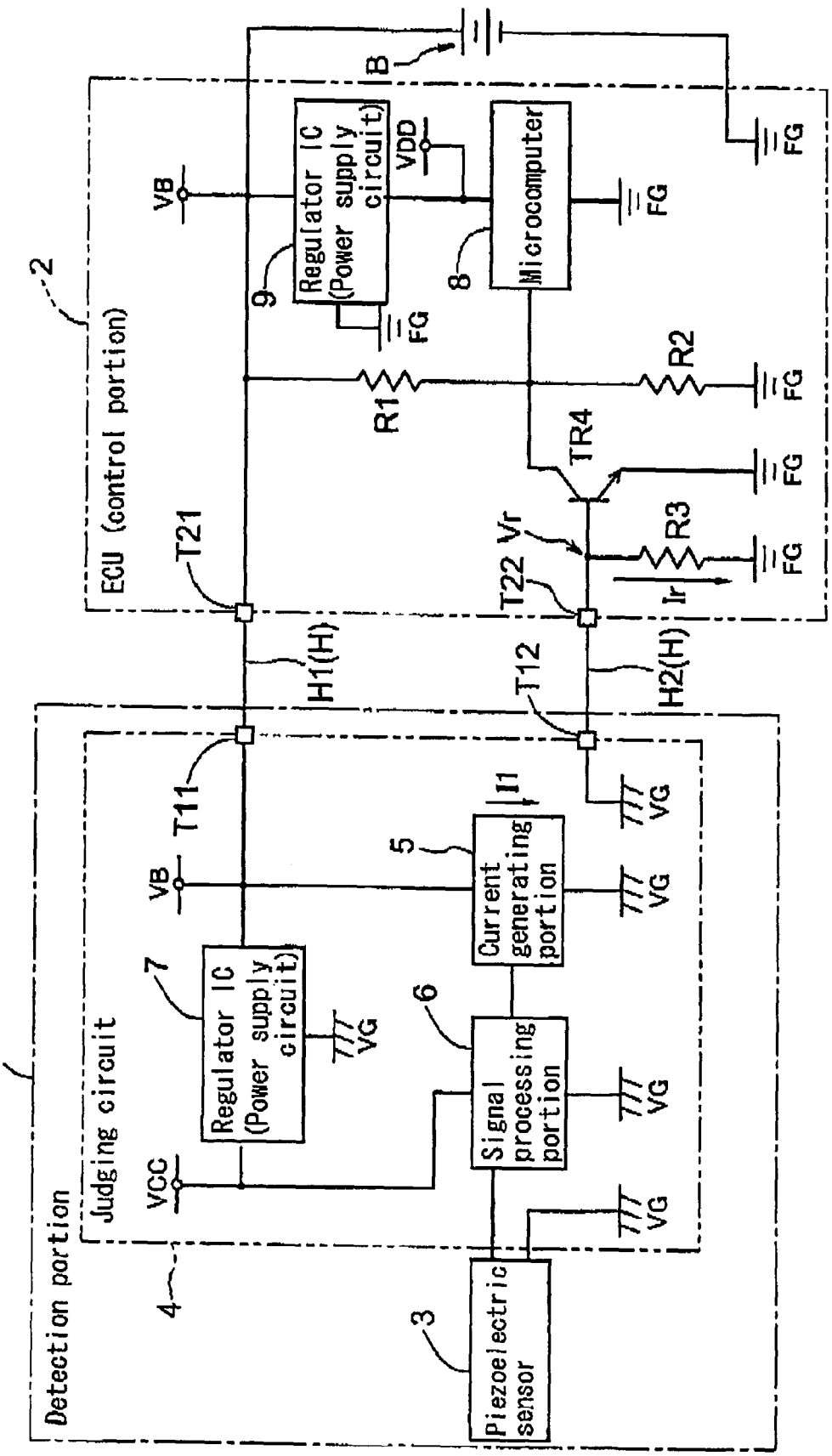
FIG. 1 represents a schematic block diagram illustrating an example of an entrapment detecting system according to an embodiment of the present invention.

As illustrated in FIG. 1, the judging circuit 4 includes a power supply circuit 7, a signal processing portion 6, and a current generating portion 5. The power source circuit 7 is, for example, a regulator IC 7 as illustrated in FIG. 1. The regulator IC 7 converts a voltage VB [V: Volt] supplied from a battery B of the vehicle 17 through the ECU 2 into a voltage VCC [V], which is a power source voltage of a circuit element in the signal processing portion 6. In this example, the voltage VB is approximately 12V, and the voltage VCC is 5V, 3.3V, 2.5V, or the like.

The signal processing portion 6 includes a filter circuit, a comparator circuit, or the like. The filter circuit is a circuit for extracting a voltage signal in a predetermined frequency band from a voltage signal including a frequency component output from the piezoelectric sensor 3 in accordance with a mechanical vibration frequency. The comparator circuit is a circuit for judging amplitude of the voltage signal output from the piezoelectric sensor 3 in accordance with a mechanical vibration (shock). As for the filter circuit and the comparator, a conventional operational amplifier is utilized. As the operational amplifier, various kinds of a versatile IC are provided. The power supply voltage of such operational amplifier is the voltage VCC described above. For stably operating the operational amplifier, the power supply is stabilized by the regulator IC 7. The signal processing portion 6 processes the output from the piezoelectric sensor 3 by the filter circuit and the comparator circuit, then the signal processing portion 6 judges whether or not the processed output corresponds to a predetermined condition which indicates an occurrence of an entrapment, and thereafter the signal processing portion 6 outputs a stable voltage signal, which indicates the result thereof. The stable voltage signal means a voltage signal, which indicates a state of H or L by a direct current component of a predetermined period of time. In the embodiment, H is the voltage VCC, and L is a ground VG of the judging circuit 4.

The current generating portion 5 corresponds to a current control portion according to the embodiment of the present invention. The current generating portion 5 generates a current in a case where it is judged that an entrapment occurred on the basis of the output of the piezoelectric sensor 3, in other words, on the basis of a judged result of the signal processing portion 6. Generation of a current 11 by the current generating portion 5 increases a consumed current of the judging circuit 4 (consumed current of the detection portion 1) by the generated current 11. On the basis of the consumed current, the ECU 2 judges whether or not an object was entrapped by the opening/closing apparatus. During this time, it is also possible that the signal processing portion 6 outputs a judged result corresponding to a level of acceleration detected by the piezoelectric sensor 3 and the current generating portion 5 generates a current corresponding to the judged result from the signal processing portion 6. By doing so, the amount of change of the consumed current of the detection portion 1 changes corresponding to the current generated by the current generating portion 5. Then, it is also possible that the control portion 2 detects the amount of change of the consumed current of the detection portion 1 changing as described above and the control portion 2 detects a level of acceleration.

Figure 4:
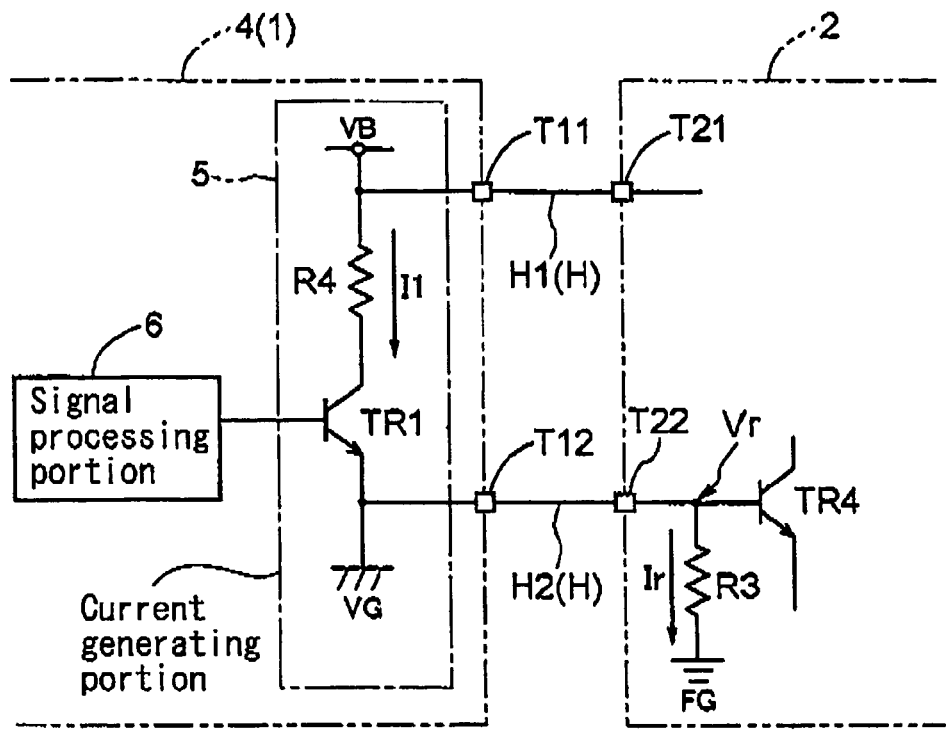
FIG. 4 represents a schematic circuit diagram illustrating an example of a current generating portion illustrated in FIG. 1 according to the embodiment.

FIG. 4 represents a schematic circuit diagram illustrating an example of the current generating portion 5 according to the embodiment of the present invention. As illustrated in the figure, the current generating portion 5 includes a resistor R4 connected to the voltage VB and a transistor TR1 of an NPN type having a collector connected to the resistor R4 and an emitter connected to the ground VG. The output of the signal processing portion 6, which becomes H in a case where it is judged that an entrapment occurred on the basis of the output from the piezoelectric sensor 3, is connected to a base of the transistor TR1. The transistor TR1 of the current generating portion 5 is switched on on the basis of the H signal, and current flows from the voltage VB to the ground VG through the resistor R4. The level of the current is determined from a constant of the resistor R4 on the basis of Ohm's law. In a case where the output from the signal processing portion 6 is L, the transistor TR1 is switched off. Accordingly, current does not flow from the voltage VB to the ground VG through the resistor R4.

As illustrated in FIG. 1 and FIG. 4, the ground VG of the judging circuit 4 is connected to the ECU 2 through the cable H2, which connects the terminal T12 of the judging circuit 4 with the terminal T22 of the ECU 2. Further, in the ECU 2, the ground VG is connected to a ground FG of the ECU 2 through a resistor R3 included in the ECU 2. In other words, the ground VG of the judging circuit 4 is not identical with the ground FG of the ECU 2. In a case where a consumed current Ir of the detection portion 1 is near zero, voltage of the ground VG becomes approximately the same as that of the ground FG. However, difference in voltage between the ground VG and the ground FG changes according to the consumed current Ir of the detection portion 1. Here, in the judging circuit 4, because the ground VG functions as a single ground, the judging circuit 4 is able to operate in a stable condition. In the meantime, because the ground VG of the judging circuit 4 is connected with the ground FG of the ECU 2 (and the battery B) through the resistor R3 of the ECU 2, it comes to that the judging circuit 4 is connected in a closed circuit of the ECU 2 in series. In other words, it comes to a closed circuit of the power source (voltage VB)—the detection portion 1—the resistor R3—the ground FG.

Here, because approximately all of the consumed current Ir of the detection portion 1 flows to the ground FG through the resistor R3, a voltage Vr between both ends of the resistor R3 (difference in voltage between the ground VG and the ground FG) becomes a product of resistance of the resistor R3 with the consumed current Ir. Here, if the consumed current Ir and the resistor R3 are adjusted so that the voltage Vr can become a voltage, which can switch on the transistor TR4, an input to a microcomputer 8 becomes L level (ground PG). The L level input to the microcomputer 8 transmits a detection of an entrapment detected by the detection portion 1, and the microcomputer 8 judges that an entrapment occurred. Here, power supply of the microcomputer 8 is provided from the battery B and regulated to a voltage VDD by a regulator IC 9.

In the meantime, also in a conventional entrapment detecting system, in which a conventional pressure-sensitive sensor is utilized in a detection portion 10, as illustrated in FIG. 6, an input to the microcomputer 28 becomes L level in a case where an entrapment occurred. In other words, because a wire of the detection portion 10 contacts each other because of the entrapment and the switch S is switched on, a terminal of the resistor R20 at a side of the microcomputer 28 becomes the ground FG. As described above, also in the embodiment of the present invention, an input to the microcomputer 8 of the control portion 2 is L level at the time of the detection of an entrapment. Accordingly, changes are not necessary for connection to the microcomputer 8 and a program of the microcomputer 8. As a result, the conventional entrapment detecting system, in which the conventional pressure-sensitive sensor is utilized in the detection portion 10, can be preferably replaced with the entrapment detecting system, in which the piezoelectric sensor is utilized in the detection portion 1. Though some changes are required for a substrate of the ECU 2, comparing with a change of a mask for the microcomputer 8 or the like, such changes are minor. Accordingly, a system can be changed with a minimum change.

Most of the consumed current Ir, which is an entire consumed current of the detection portion 1, is generated by the current generating portion 5. A consumed current of the signal processing portion 6, in which a versatile operational amplifier is utilized, is not large. Further, because the consumed current of the signal processing portion 6 is not large, the regulator IC 7 utilized can be low current capacity and low cost. On the other hand, the current generating portion 5 generates the large current I1 on the basis of the output from the signal processing portion 6. Accordingly, the consumed current Ir becomes approximately equal to the current I1 generated by the current generating portion 5. Because the consumed current Ir, before the current I1 is added, is small, the voltage Vr between both ends of the resistor R3 does not become so high a voltage, which can switch on the transistor TR4. Accordingly, in a case where the piezoelectric sensor 3 does not detect an entrapment, the transistor TR4 is switched off, and the input to the microcomputer 8 becomes a voltage of H level determined by a separation of a voltage between the battery B (voltage VB) and the ground FG by a resistor R1 and a resistor R2. Therefore, the microcomputer 8 judges that an entrapment did not occur.

In the meantime, when the voltage Vr, between both ends of the resistor R3, becomes high, the voltage of the ground VG of the judging circuit 4 becomes high relative to the ground FG of the battery B, and a voltage difference between the voltage of the ground VG and the voltage VB of the battery B becomes small. However, it is not problematical because the detection portion (judging circuit 4) includes the regulator IC 7 and the power supply voltage for the signal processing portion 6 is stabilized to the voltage VCC on the basis of the ground VG. In the example illustrated in FIG. 4, the voltage VB is utilized as a power supply for the current generating portion 5. Because the current generating portion S generates a large current, if the voltage VCC is utilized as the power supply voltage, there would be a requirement that the regulator IC 7 has a large capacity. In the embodiment, as described above, the voltage VB is utilized for the power supply of the current generating portion 5 so that even a small capacity of the regulator IC 7 can be sufficient.

Figure 5:
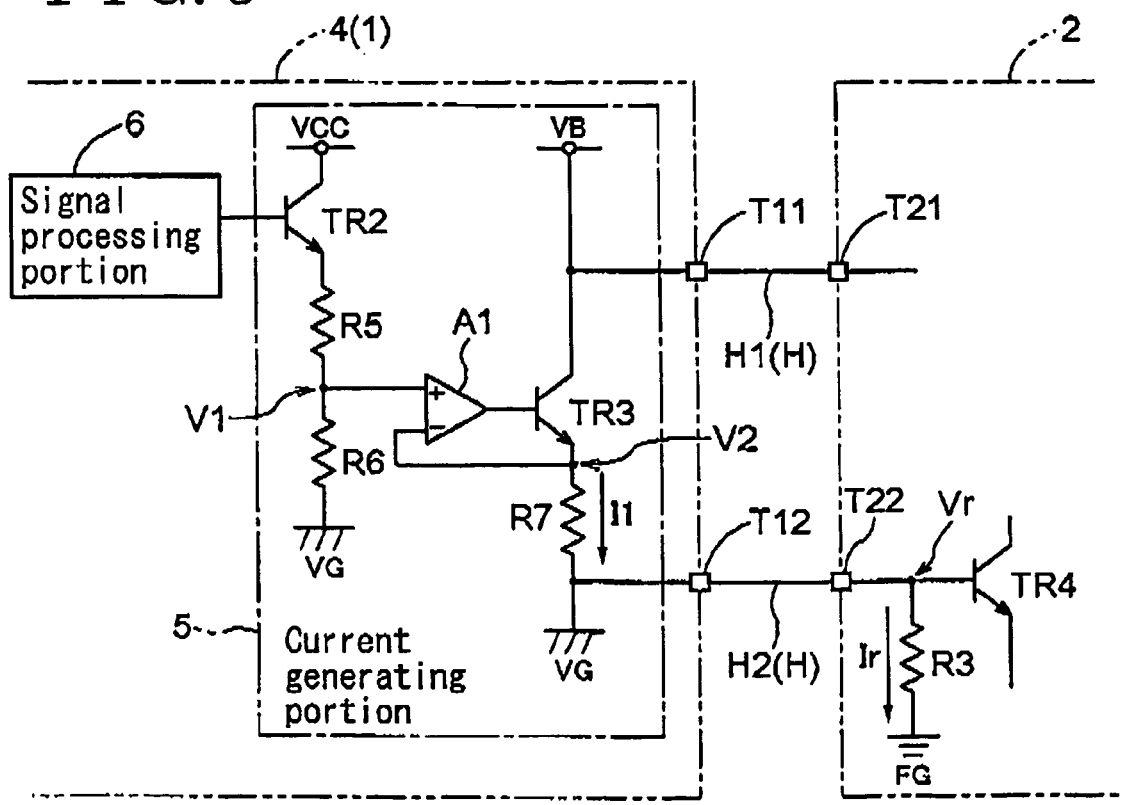
FIG. 5 represents a schematic circuit diagram illustrating another example of the current generating portion illustrated in FIG. 1 according to the embodiment.

FIG. 5 represents a schematic circuit diagram illustrating another example of a current generating portion 5 according to the embodiment of the present invention. As described above, a voltage difference between the voltage VB of the battery B and the ground VG of the judging circuit 4 changes according to the voltage Vr between both ends of the resistor R3 of the control portion 2. Further, because the battery B is utilized as a power supply of various kinds of actuators such as motors or solenoids, which require large power, change of voltage is large. Accordingly, the current I1 increased by the current generating portion 5 is influenced from the change of the voltage VB. For overcoming this, in another configuration example illustrated in FIG. 5, a constant current circuit is provided so that the current I1 does not fluctuate in large amounts, even when the voltage VB changes and difference in voltage between the voltage VB and the ground VG changes.

As illustrated in FIG. 5, an operational amplifier A1 performs a feedback control (voltage follower) so that the voltage V2 between both ends of a resistor R7 maintains a voltage V1 determined by a voltage separation by resistors. As a result, the current I1 flowing in the resistor R7 can be constant. The voltage V1 is based on the voltage VCC stabilized by the regulator IC 7 and is separated by a resistor R5 and a resistor R6 so that the voltage V1 is not influenced from the change of the voltage. Because, substantially, no current flows into the operational amplifier A1, in a case where the resistor R5 and the resistor R6 have sufficiently large resistance (equal to or more than several tens of kΩ), the consumed current Ir is not practically influenced. The transistor TR2 is switched on only in a case where the signal processing portion 6 detects an entrapment on the basis of the output from the piezoelectric sensor 3. Accordingly, in a state where an entrapment is not detected, the transistor TR2 is switched off, the voltage V1 becomes the ground VG, the transistor TR3 is also switched off, and the current I1 does not flow in the resistor R7. Because the consumed current Ir, before the current I1 is added, is small, the voltage Vr between both ends of the resistor R3 of the control portion 2 does not reach such a high voltage, which can switch on the transistor TR4. Accordingly, in a case where the piezoelectric sensor 3 does not detect an entrapment, the transistor TR4 is switched off, and the microcomputer 8 judges that an entrapment did not occur.

As described above, according to the embodiment of the present invention, an entrapment detecting system, which can be obtained by changing a pressure-sensitive sensor, utilized in an entrapment sensor, to a piezoelectric sensor with a minimum system change, and which has a good sensitivity, can be provided.

According to an aspect of the present invention, an entrapment detecting system includes a detection portion provided at an opening/closing apparatus for detecting an acceleration of the opening/closing apparatus on the basis of an output from a piezoelectric sensor for outputting a voltage corresponding to the acceleration of the opening/closing apparatus and a control portion for judging whether or not an object is entrapped by the opening/closing apparatus on the basis of a detected result of the detection portion. The detection portion includes a current control portion connected to the control portion in series as a closed circuit whereby electricity is supplied from the control portion to the current control portion. The current control portion changes a consumed current of the detection portion on the basis of the output from the piezoelectric sensor. The control portion judges whether or not the object is entrapped by the opening/closing apparatus on the basis of the consumed current of the detection portion changed by the current control portion.

In a conventional entrapment detecting system, in which a pressure-sensitive sensor is utilized in the detection portion, a control portion judges an occurrence of an entrapment according to a changed voltage determined by a voltage separation of resistors, of which resistance is changed according to a degree of contact of wires in the pressure-sensitive sensor. In other words, the detection portion is configured as a circuit for separating a voltage between a power supply and a ground by resistors, in other words, a closed circuit of the control portion. The detection portion is connected with the control portion through two terminals. For utilizing a piezoelectric sensor in the detection portion, for example, since an output voltage from the piezoelectric sensor is small, a circuit for processing signals for processing the output from the piezoelectric sensor is required. Accordingly, it becomes necessary that the detection portion be connected with the control portion through three terminals for supplying power to the signal processing circuit and for outputting the output from the signal processing circuit. However, according to the aspect of the present invention, the current control portion changes a consumed power of the detection portion on the basis of the output from the piezoelectric sensor, which is a change of voltage. In other words, the current control portion changes the consumed power of the detection portion, which is connected to the control portion in series as a closed circuit whereby power is supplied. Because the detection portion is connected with the control portion in series as the closed circuit of the control portion, the detection portion can be connected with the control portion through only two wires in a similar manner of the detection portion, in which the pressure-sensitive sensor is utilized. Then, change of the consumed current can be detected by measuring the current flowing between the power supply and the ground. For supplying power from the control portion to the detection portion, a voltage of one of the two wires is a power supply voltage of the detection portion, and a voltage of the other is the ground for the detection portion. Therefore, according to the aspect of the present invention, power can be supplied to the signal processing circuit included in the detection portion and a change, of the consumed current of the detection portion, can be detected by the control portion. As a result, an entrapment detecting system, which can be obtained by changing a pressure-sensitive sensor utilized in an entrapment detection sensor to a piezoelectric sensor with a minimum system change, and which has a good sensitivity, can be provided.

According to a further aspect of the present invention, the current control portion can increase the consumed current of the detection portion on the basis of the output from the piezoelectric sensor in a case where the object is entrapped by the opening/closing apparatus.

At the time of normal operation in which the piezoelectric sensor does not detect an acceleration, the piezoelectric sensor does not generate a change of a voltage signal. Then, because the signal processing circuit in the detection portion does not operate, a consumed current of the detection portion is very small. Accordingly, when the current control portion increases a level of current on the basis of the output from the piezoelectric sensor, the consumed current of the detection portion increases, and difference between before/after generation of the acceleration can be clearly judged by the control portion. As a result, an entrapment detecting system, by which an entrapment can be preferably detected, can be obtained. In the meantime, also in a situation where the current control portion increases a level of current at the time of normal operation of the piezoelectric sensor and the current control portion decreases the level of current in a case where the piezoelectric sensor detects an acceleration, difference between before/after the generation of the acceleration can be clearly judged by the detection portion. However, the configuration described above, in which the current control portion increases a level of current at the time of the detection of the acceleration, a level of consumed current can be restrained at the time of normal operation, in which an acceleration is not generated. The restriction of consumed current can be effective for power saving in the entire system.

According to a further aspect of the present invention, the current control portion can include a constant current circuit.

In a power supply for a vehicle, voltage change is large because the power supply is utilized for various kinds of actuators, such as a motor or a solenoid, which require a large level of power. Accordingly, the current increased by the current control portion included in the detection portion (consumed current of the detection portion) is influenced by the change of the power supply voltage. For overcoming this, the current control portion is configured from the constant current circuit so that increase of the consumed current does not fluctuate in large amounts even when the power supply voltage changes. If the constant current generated by the constant current circuit is sufficiently large in comparison with the consumed current of the circuit of the detection portion other than the constant current circuit (current control portion), the increase of the consumed current of the detection portion at the time of the detection of an acceleration does not fluctuate in large amounts. By doing so, accuracy of the control portion for judging an occurrence of an entrapment on the basis of the consumed current of the detection portion can be high.

According to a further aspect of the present invention, the piezoelectric sensor can be provided at an end portion of a slide door of a vehicle. In a case where the piezoelectric sensor is provided at an end portion of a slide door of a vehicle, an entrapment detecting system according to the aspect of the present invention can be utilized as an entrapment detecting system for a vehicle. In a slide door apparatus for a vehicle, of which demand is increasing recently, safety thereof can be improved.

The principles, preferred embodiment and mode of operation of the present invention, have been described in the foregoing specification. However, the invention that is intended to be protected is not to be construed as limited to the particular embodiments disclosed. Further, the embodiments described herein are to be regarded as illustrative rather than restrictive, Variations and changes may be made by others, and equivalents employed, without departing from the spirit of the present invention. Accordingly, it is expressly intended that all such variations, changes and equivalents that fall within the spirit and scope of the present invention as defined in the claims, be embraced thereby.

The invention claimed is:

1. An entrapment detecting system, comprising:
   a detection portion provided at an opening/closing apparatus for detecting an acceleration of the opening/closing apparatus on the basis of an output from a piezoelectric sensor for outputting a voltage corresponding to the acceleration of the opening/closing apparatus; and
   a control portion for judging whether or not an object is entrapped by the opening/closing apparatus on the basis of a detected result of the detection portion, wherein
   the detection portion includes a current control portion connected to the control portion in series as a closed circuit whereby electricity is supplied from the control portion to the current control portion, the current control portion for changing a consumed current of the detection portion on the basis of the output from the piezoelectric sensor, and the control portion judges whether or not the object is entrapped by the opening/closing apparatus on the basis of the consumed current of the detection portion changed by the current control portion.

2. The entrapment detecting system according to claim 1, wherein
   the current control portion increases the consumed current of the detection portion on the basis of the output from the piezoelectric sensor in a case where the object is entrapped by the opening/closing apparatus.

3. The entrapment detecting system according to claim 1, wherein
   the piezoelectric sensor is provided at an end portion of a slide door of a vehicle.

4. The entrapment detecting system according to claim 2, wherein
   the piezoelectric sensor is provided at an end portion of a slide door of a vehicle.

5. The entrapment detecting system according to claim 2, wherein
   the current control portion includes a constant current circuit.

6. An entrapment detecting system, comprising:
   a detection portion provided at a slide door of a vehicle and including a piezoelectric sensor for outputting a voltage according to a moving state of the slide door, the detection portion detecting the moving state of the slide door on the basis of an output from the piezoelectric sensor; and
   a control portion for judging whether or not an object is entrapped between the slide door and a door frame of the vehicle when the slide door moves on the basis of a detected result of the detection portion, wherein
   the detection portion is connected to the control portion in series whereby electricity is supplied from the control portion to the detection portion, the detection portion includes a current control portion for changing a consumed current of the detection portion on the basis of the output from the piezoelectric sensor, and the control portion judges whether or not the object is entrapped on the basis of the consumed current of the detection portion.

7. The entrapment detecting system according to claim 6, wherein
   the detection portion includes a judging circuit having a power supply circuit, a signal processing portion, and a current generating portion.

8. The entrapment detecting system according to claim 7, wherein
   the signal processing portion extracts a voltage signal of a predetermined frequency band from a voltage signal outputted from the piezoelectric sensor.

9. The entrapment detecting system according to claim 7, wherein
   the current generating portion generates a current in a case after the judgment of the signal processing portion on the basis of the output from the piezoelectric sensor that an entrapment occurred.

10. The entrapment detecting system according to claim 7, wherein
    the current generating portion generates a current according to a judged result of the signal processing portion.

11. The entrapment detecting system according to claim 7, wherein
    the current generating portion includes a resistor connected to a power supply and a transistor having a collector connected to the resistor, a base connected to the signal processing portion and an emitter connected to a ground.

12. The entrapment detecting system according to claim 6, wherein
    the piezoelectric sensor is provided between the slide door and the door fame.

* * * * *